United States Patent [19]
Freytsis et al.

[11] Patent Number: 5,350,427
[45] Date of Patent: Sep. 27, 1994

[54] WAFER RETAINING PLATEN HAVING PERIPHERAL CLAMP AND WAFER LIFTING MEANS

[75] Inventors: Avrum Freytsis, Swampscott; Richard J. Hertel, Boxford, both of Mass.

[73] Assignee: Varian Associates, Inc., Palo Alto, Calif.

[21] Appl. No.: 76,509

[22] Filed: Jun. 14, 1993

[51] Int. Cl.⁵ ............................ B05C 13/00; B05C 11/02
[52] U.S. Cl. ........................... 29/25.01; 118/503; 118/730; 279/131; 437/925
[58] Field of Search ............... 437/925; 29/25.01; 118/503, 730; 279/129, 130, 131

[56] References Cited

U.S. PATENT DOCUMENTS

| | | | |
|---|---|---|---|
| 3,993,018 | 11/1976 | Kranik et al. | 118/52 |
| 4,677,758 | 7/1987 | Algo | 34/58 |
| 4,744,713 | 5/1988 | Hrovath | 414/222 |
| 4,817,556 | 4/1989 | Mears et al. | 118/503 |
| 4,971,676 | 11/1990 | Dove et al. | 204/297 R |
| 5,040,484 | 8/1991 | Mears et al. | 118/730 |

FOREIGN PATENT DOCUMENTS

| | | | |
|---|---|---|---|
| 61-105854 | 5/1986 | Japan | 437/925 |
| 63-192247 | 9/1988 | Japan | 118/503 |
| 4-150051 | 5/1992 | Japan | 279/131 |
| 665951 | 6/1979 | U.S.S.R. | 279/131 |
| 1129672 | 12/1984 | U.S.S.R. | 29/25.01 |

Primary Examiner—Olik Chaudhuri
Assistant Examiner—David E. Graybill
Attorney, Agent, or Firm—Bella Fishman

[57] ABSTRACT

An apparatus for releasably holding a workpiece in semiconductor process systems such as a batch ion implanter which comprises a linkage mechanism mounted onto the backside of the platen for clamping the wafer against the fence of the supporting means and pusher means mounted on wafer lift means for engagement with the lever mechanism for locking and unlocking the device, and sensing any misclamp of the workpiece.

11 Claims, 3 Drawing Sheets

WAFER RETAINING PLATEN HAVING PERIPHERAL CLAMP AND WAFER LIFTING MEANS

FIELD OF THE INVENTION

The present invention relates generally to a wafer retaining mechanism for semiconductor processing equipment, and more particularly, to wafer holder apparatus used in batch type ion implanters.

BACKGROUND OF THE INVENTION

In batch type ion implanters a number of wafers are mounted on a cooled platen forming part of a spinning implant disc and exposed to the ion beam for doping semi-conductor wafers. This arrangement allows increased throughput by using a high current ion beam while maintaining the temperature of the wafers within the acceptable range.

Many efforts have been made to improve ion implantation technique by elimination of contamination and cross-contamination.

One source of contamination is sputtering of accumulated ion species from wafer holders exposed to the ion beam onto the wafer. These species function as cross-contaminants of previous implantations.

Another source of contamination is particles falling on the wafer during wafer processing. Most particles are produced by improper clamping of the wafer. The particles disposed on the wafer surface before the implantation process screen the implantation. The particles which fall on the wafer after implantation cause contamination of the following processed wafer.

Early devices for retaining wafers during ion implantation utilized either peripheral clamping mechanisms, for example, devices with a clamp ring engaging the front surface of the wafer or centrifugal clamping apparatus to hold the wafer on the cooled platen.

Along with the desire to prevent particulate formation and cross contamination in both types of clamping, the wafers must be protected from physical damage during the process. To avoid breakage of the wafers, they should be accurately positioned at the disc before clamping them thereon.

Peripheral clamping devices such as a clamp ring obstruct part of the front surface of the wafer and are susceptible to particle generation effects. Because of build-up of sputtered material on the clamp ring, the ring can be a source of particulate contamination. During the implantation process, the clamping ring is exposed to the ion beam and becomes a source of sputtered contamination from the clamping ting to the surface of the wafer. Moreover, the shadowed portion of the wafer is not exposed to the implantation process.

Centrifugal clamping techniques eliminate the need for clamping members that contact the wafer surface, and reduce the amount of wafer holder exposed to the ion beam above the wafer's plane. A centrifugal clamping arrangement provides the whole surface of the wafer for ion treatment, but specific mechanically complicated disc structure is required for producing sufficient centrifugal force for clamping.

One attempt to provide better utilization of the wafer surface and reduce both particle generation and sputter contamination effects was disclosed in U.S. Pat. No. 4,817,556 "Apparatus for Retaining Wafers" assigned to the assignee of the present invention. This mechanism is located primarily on the backside of the platen and uses edge handling. A flexible collet with a number of fingers around the periphery of the wafer retains the wafer by contacting its edge protruding above the surface of the platen. The platen has a plurality of grooves around its periphery, and each groove accommodates a finger. The outside portion of the collet is molded into and supported by an elastomer ring so as to allow the collet to flex, moving the fingers outward so that the wafer can be loaded onto the platen. The multiple grooves in the platen expose the flexible collet and its elastomer supporting ring to the ion beam. When the collet is actuated the material deposited by the ion beam, as well as the wear particles generated in the mechanism, are ejected and can deposit on the front surface of the wafer.

A multi-axis robotic system which is used in U.S. Pat. No. 4,817,556 for loading wafers onto the platens of the implant disc creates a certain amount of positioning error, particularly when operating inside a large vacuum chamber where perfect alignment is difficult to achieve. The rather limited movement of the fingers provided by the flexing of the collet makes this design sensitive to these positioning errors. Any misclamped wafer could be broken during the implant process causing loss of valuable material and expensive downtime to clean the implanter. Therefore, reliable operation of the wafer retaining mechanism could be provided by including wafer misclamp detection on systems, so that misclamped wafers could be reclamped.

An attempt to solve the positioning problem is described in U.S. Pat. No. 4,744,713 "Misalignment Sensor for a Wafer Feeder Assembly" detects wafer position to prevent misclamping of the wafer by sensing a collimated light beam reflected off the surface of the wafer. To implement the design a light source and a light sensor have to be placed on a supporting structure inside the vacuum chamber of the ion implanter far enough from the surface of the wafer to allow the disc transition from the wafer loading position to the implant position. To ensure reliable detection of misclamped wafers, a precise alignment of the implant disc and the components of the sensing system has to be maintained. Though the device effectively provides security against misalignment in the mounting of the wafer and avoids possible physical damage to the wafer, the clamping of the wafer is maintained with a peripheral clamping mechanism. This wafer clamping system includes a retractable spring loaded clamp with two arms which engage the wafer when loaded, wherein, in operation part of the wafer is overshadowed by the arms. The arms being exposed to the ion beam accumulate species which become cross-contaminants in a following implantation process.

SUMMARY OF THE INVENTION

It is one object of the present invention to provide a wafer retaining mechanism for mechanically clamping a semiconductor wafer against a platen which is particularly used on a spinning disc of a batch ion implanter.

It is another object of the present invention to provide a wafer retaining mechanism which senses wafer clamping, decreases wafer contamination and cross-contamination effects by reducing the exposure of the components of the wafer retaining mechanism to the ion beam, and avoids mechanical damage to the wafer.

These and other objects of the present invention are achieved by a wafer retaining mechanism having a platen with a fence for supporting the wafer; clamp means which holds the wafer against the fence of the platen; spring means and lever means for reciprocating motion of the clamp means to and from the center of the platen; an electronically insulated pusher means which activates the lever means, and provides the reciprocating movement of the lever means; and lifting means coupled to the pusher for lifting the wafer from the platen after the clamp means has released the wafer. Monitoring the position of the pusher when the pusher disengages with the lever provides an indication of proper wafer retention without requiring any alignment of the components. All of the elements of the mechanism, except for the clamp means, are mounted on the backside of the platen preventing their exposure to the ion beam.

Other aspects of the present invention will become apparent from the following detailed description, taken in conjunction with the accompanying drawings illustrating by way of example the principles of the invention.

DETAILED DESCRIPTION OF THE INVENTION

Figure 1:
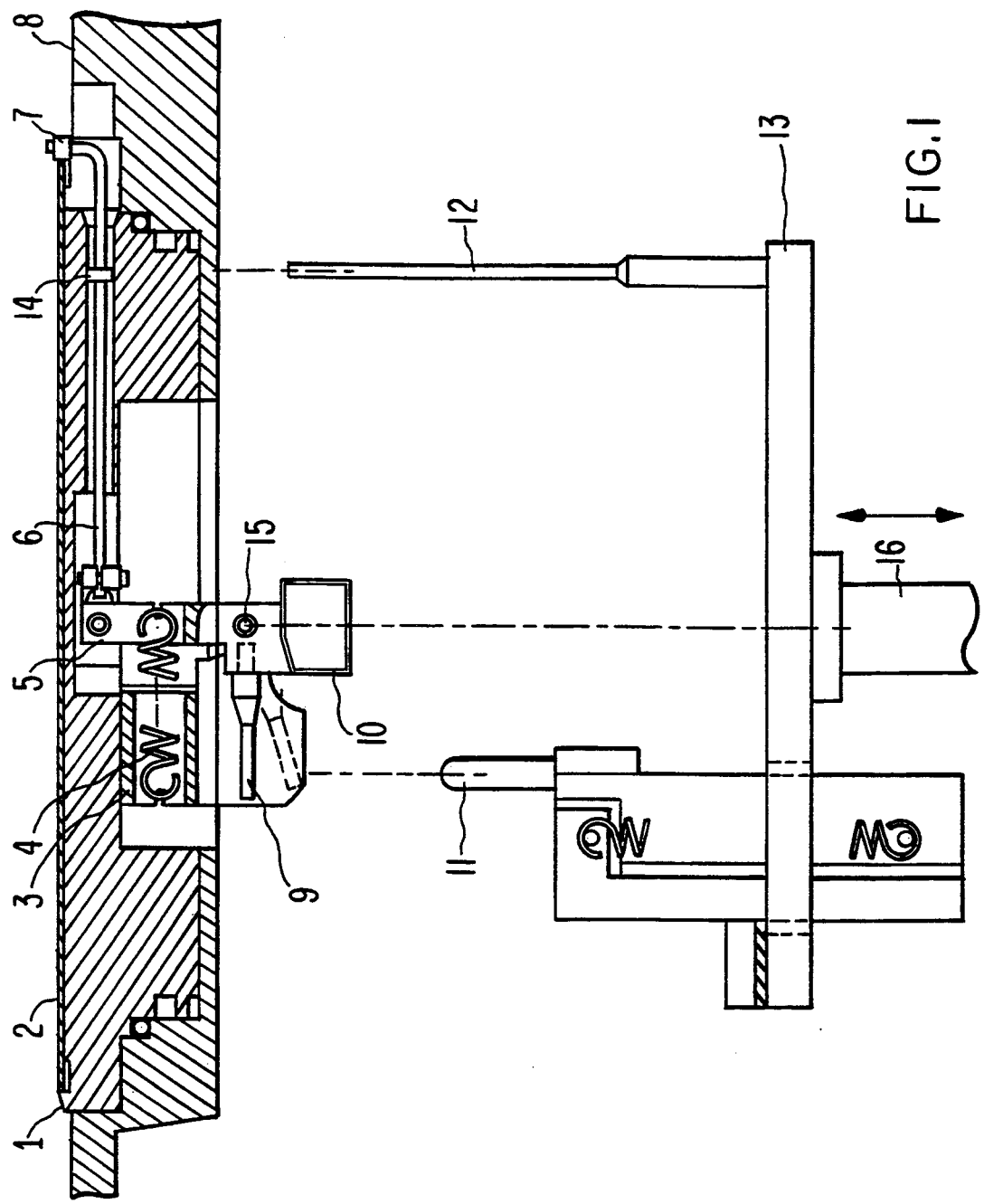
FIG. 1 is a detailed cross sectional view of an apparatus for releasably holding wafers on a spinning disc of a batch ion implanter constructed according to the present invention.
Figure 2:
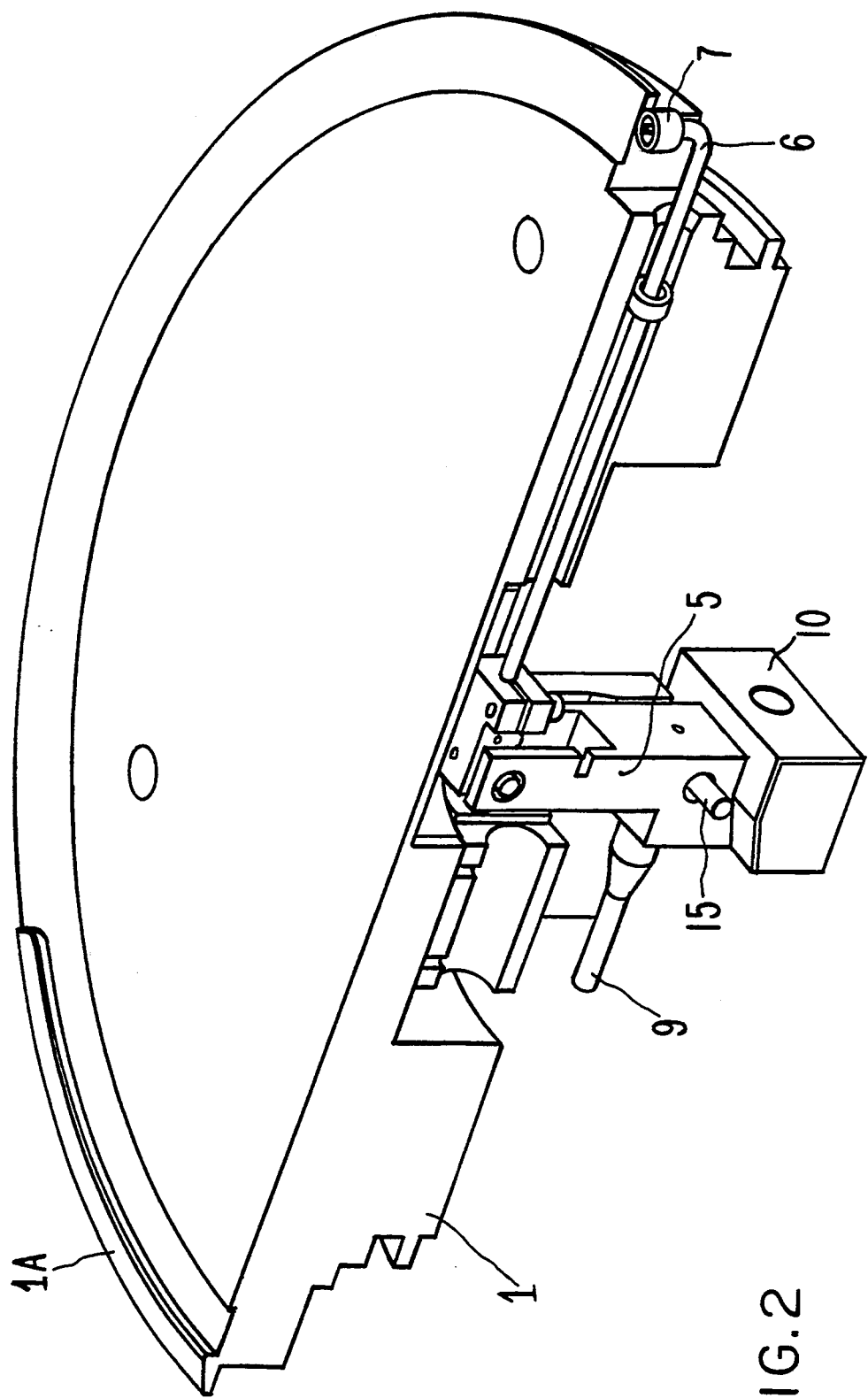
FIG. 2 is a cut-away partial perspective view of the apparatus for retaining wafers according to the present invention.

FIG. 1 depicts a wafer-holder apparatus which includes a wafer-receiving platen 1. Platen 1 is installed in spinning disc 8 of a batch processing ion implantation system and having a plurality of through holes (not shown). Platen 1 has a fiat front surface exposed to the ion implant beam and a rear surface mounted on the spinning disc 8. Fence 1A (shown in FIG. 2) is configured as a raised circular portion on the periphery of the front surface of platen 1 to match the circumference of the wafer 2 so as to engage a side surface of the wafer 2.

The apparatus further comprises pull rod 6 which is installed in guide busing 14. The first end of pull rod 6 is bent outwardly toward the front surface of platen 1. Roller 7 is mounted on the first end of pull rod 6 so that roller 7 and the first end of pull rod 6 extend above the front surface of the platen 1 so as to engage the edge of the wafer 2. The second end of pull rod 6 is attached to pivoting lever 5 which is supported by housing 3. Lever 5 rotates around pivot point 15. Spring 4 is positioned within housing 3. Spring 4 provides the force required to move the wafer 2 towards fence 1A of the platen 1 and retain the wafer 2 while disc 8 is in a vertical position. Finger 9 extends from the side of lever 5 below the spinning disc 8 opposite the side to which pull rod 6 is attached. Counterweight 10 is attached to the underside of pivoting lever 5. The apparatus further comprises spring loaded pusher mechanism 11 coupled with wafer lift plate 13 mounted on drive shaft 16. Lift pins 12 are mounted on wafer lift plate 13.

In operation, wafers are loaded and unloaded in the implant chamber when the disk is in a horizontal position. Disc 8 is rotated so that the wafer platen is in position to receive a wafer which is conveyed to the disc. An example of an implantation system with a mechanism suitable for loading the wafers onto a platen and an overview of typical operations is provided in U.S. Pat. No. 4,817,556, assigned to the assignee of the present invention, which is incorporated herein by reference.

After loading of wafers is completed, disc 8 is pivoted into the vertical plane for implant, approximately perpendicular to ion beam, and then disc 8 is spun. Roller 7 presses wafer 2 against fence 1A by the force of spring 4. Disc has to be brought up to speed. When the spinning speed achieves the value of approximately 400 rpm and wafer 2 is securely held to the platen by the centrifugal force, counterweight 10 which is also subject to the centrifugal force will overcome the bias of the spring 4 and by means of pivoting lever 5 will move pull rod 6 with roller 7 away from wafer 2. When the implant process is completed and the disc spinning speed is reduced, roller 7 will return to its original position retaining wafer 2 in place while the disc 8 is being transferred to the horizontal position for wafer 2 batch reloading.

To open the wafer retaining mechanism, wafer lift plate 13 with lift pins 12 is raised by a linear actuating mechanism connected to drive shaft 16 (FIG. 1). Pusher 11 first contacts finger 9 and pivots lever 5 extending spring 4 and moving pull rod 6 with roller 7 away from the edge of wafer 2. Continued upward motion of the wafer lift plate 13 will cause lift pins 12 to contact and then raise wafer 2 above the surface of the platen so that wafer 2 can be accessed by a robotic loading device.

Figure 3:
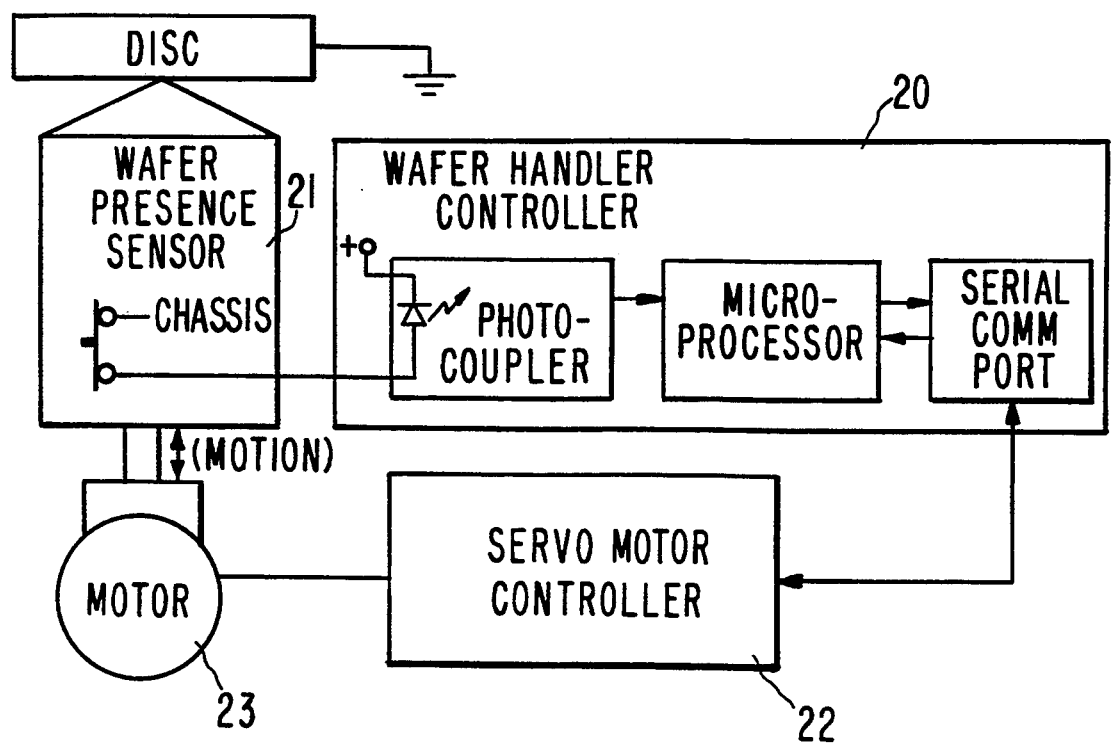
FIG. 3 is a schematic block diagram of a wafer detection sub-system for use with the wafer retaining mechanism of the invention.

After a new wafer is delivered to pins 12 by the robotic loading device, pins 12 lower wafer 2 onto the surface of platen 1. When wafer 2 is placed on the platen 1 and pins 12 continue their movement downward, pusher 11 starts moving downward with finger 9 following its movement and maintaining contact with pusher 11 until roller 7 engages and locks wafer 2 against the fence of platen 1. After that, finger 9 stops moving, and the electrical contact between pusher 11 and finger 9 is interrupted. The break in the electrical contact is detected by wafer handler controller 20, which is a part of conventional detection systems further including wafer presence sensor 21, servo motor controller 22, and motor 23 shown in FIG. 3. If wafer 2 was delivered to platen 1 with too large an error, such as being placed over the fence or over the roller, it will not be clamped and roller 7 will continue its motion to the end of the stroke range with finger 9 maintaining electrical contact with pusher 11. Since the position of the pusher means is continuously monitored by the wafer handler controller 20 it is possible to detect whether the electrical contact was interrupted before the end of the stroke of pusher 11 and so identify a misclamped of wafer 2.

It should also be noted that the geometry of the linkages of the wafer retaining mechanism is such as to provide close to linear motion of pull rod 6 decreasing therefor relative motion between roller 7 and the edge of wafer 2. Most of the elements of the wafer clamping apparatus are mounted onto the backside of the platen to reduce dramatically particulate generation.

Although a specific embodiment of the wafer retaining mechanism has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. An apparatus for retaining a wafer on a disc, said wafer having first and second opposed edges and flat surfaces in front and back, comprising:
   a platen for supporting the wafer, said platen having a fence for contacting the first edge of said wafer;
   clamp means mounted on said platen for reciprocating motion with respect to said fence;
   lever means pivotally attached to said clamp means;
   spring means attached to said lever means for urging said clamp means to contact the second edge of said wafer to press said first edge against said fence of said platen;
   pusher means, mounted for reciprocal motion, said pusher means moving in one direction into engagement with said lever means to move said clamp means away from said fence to release said wafer, and in the other direction out of engagement with said lever means so that said clamp means holds the wafer against said fence of said platen;
   lifting means coupled to said pusher means for lifting said wafer from said platen after said clamp means has released the wafer.

2. The apparatus of claim 1 wherein said platen has a flat front surface for contacting the flat back surface of said wafer, and a plurality of holes extending therethrough.

3. The apparatus of claim 2 wherein said clamp means further comprises:
   a pull rod having first and second ends;
   a roller mounted on said first end of said pull rod, wherein in operation said roller contacts the second edge of said wafer;
   a guide bushing placed about said pull rod.

4. The apparatus of claim 3 wherein said lever means comprises:
   a lever, said lever having first and second opposed sides the upper portion of said first side of said lever pivotally connecting to said second end of said pull rod;
   a finger, said finger fixed to the lower portion of said second side of said lever, wherein in operation said finger is moved by said pusher means to pivot said lever.

5. The apparatus of claim 4 wherein said lifting means has a plurality of lift pins, wherein in operation, said lift pins projecting through said holes to lift said wafer.

6. An apparatus for retaining a wafer on a disk comprising:
   a platen, said platen disposed on the disk and having a raised circular portion wherein said raised circular portion is oriented toward the outside of said disk and forming a wafer mounting surface, said mounting surface having a plurality of holes projecting therethrough;
   means for adjusting the position of said wafer to said circular portion of said platen;
   lever means pivoted to said adjusting means, said lever means in operation transferring the required force to move said wafer toward said circular portion;
   a finger, said finger applied to said lever means for regulating the force applied to said adjusting means by said lever means;
   wafer lift means, said wafer lift means having a plate, with a plurality of lift pins placed on said plate so that in operation said lift pins protrude through said holes of said wafer mounting surface for receiving and loading said wafer onto said mounting surface;
   pusher means, said pusher means mounted onto said plate of said wafer lift means outwardly and opposite to said finger, wherein in operation said pusher means engages said finger until said wafer is locked against said mounting surface.

7. The apparatus of claim 6 wherein said means for adjusting said wafer comprises:
   a guide bushing;
   a pull rod installed into said guide bushing, said pull rod having first and second ends projecting through said guide bushing, said first end bent outwardly to said wafer mounting surface;
   a roller positioned on said first end of said pull rod so that a small part of said roller extends over said wafer mounting surface.

8. The apparatus of claim 7 wherein said lever means comprises:
   a lever, said lever having first and second opposed sides, said first side of said lever pivotally connecting to said second end of said pull rod;
   a housing mounted to said second side of said lever, the top side of said housing attached to said platen;
   a spring disposed within said housing;
   a counterweight member fixed to the bottom of said housing, said counterweight member in operation counterbalances the centrifugal movement of said wafer held by said means for adjusting said wafer when said disc is rotated.

9. The apparatus of claim 8 wherein said finger attached to said second side of said lever opposite to said housing.

10. The apparatus of claim 9 wherein said pusher means is electrically insulated from said finger.

11. The apparatus of claim 10 wherein said raised circular portion of said platen is an integral with said platen.

* * * * *